United States Patent
Van Lievenoogen et al.

(10) Patent No.: US 9,356,539 B2
(45) Date of Patent: May 31, 2016

(54) ROTARY POSITIONING DEVICE

(71) Applicant: KONINKLIJKE PHILIPS N.V., Eindhoven (NL)

(72) Inventors: Anne Johannes Wilhelmus Van Lievenoogen, Eindhoven (NL); Georgo Zorz Angelis, Oss (NL); Justus Bjorn Post, Rosmalen (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/428,502

(22) PCT Filed: Oct. 5, 2013

(86) PCT No.: PCT/IB2013/059138
§ 371 (c)(1),
(2) Date: Mar. 16, 2015

(87) PCT Pub. No.: WO2014/054034
PCT Pub. Date: Apr. 10, 2014

(65) Prior Publication Data
US 2015/0236621 A1 Aug. 20, 2015

Related U.S. Application Data

(60) Provisional application No. 61/710,087, filed on Oct. 5, 2012.

(51) Int. Cl.
*H02N 15/00* (2006.01)
*H02K 7/09* (2006.01)
*H01L 21/68* (2006.01)

(52) U.S. Cl.
CPC ............... *H02N 15/00* (2013.01); *H01L 21/68* (2013.01); *H02K 7/09* (2013.01)

(58) Field of Classification Search
CPC ....... H02K 41/03; H02K 41/031; H02K 7/09; B60L 13/04; B60L 13/10; H01L 21/67709; H01L 21/67
USPC ........ 310/12.04, 12.05, 90.5, 12.15; 104/281, 104/283, 292; 198/619, 690.1; 414/935
See application file for complete search history.

(56) References Cited

U.S. PATENT DOCUMENTS 5,216,308 A   6/1993   Meeks
5,638,303 A * 6/1997   Edberg et al. ................. 700/302

(Continued)

FOREIGN PATENT DOCUMENTS

CN    101290476 A    10/2008
CN    101741289 A    6/2010

(Continued)

*Primary Examiner* — Burton Mullins

(57) ABSTRACT

The present invention relates to a rotary positioning device (100, 100', 100") comprising a circular magnetic track (110) generating a magnetic field across a circular air gap (113), at least three forcers (120, 121, 122), each including a plurality of coils (1201, 202, 1203) at least partly disposed with the circular air gap (113) and each being operable for generating a levitation force in a levitation direction orthogonal to the circular magnetic track and a drive force in a drive direction along the circular magnetic track, said forcers being arranged at different angular positions along said circular magnetic track, and a controller (140) for providing currents to said forcers for individually controlling the generation of a levitation force and/or a drive force by said forcers for effecting a rotational movement, and/or a tilting movement and/or a translational movement of said circular magnetic track.

11 Claims, 9 Drawing Sheets

(56) References Cited

U.S. PATENT DOCUMENTS

| | | | |
|---|---|---|---|
| 6,040,675 A * | 3/2000 | Ono | 318/649 |
| 6,054,784 A | 4/2000 | Sperling et al. | |
| 6,665,053 B2 * | 12/2003 | Korenaga | 355/72 |
| 6,864,601 B2 * | 3/2005 | Sogard | 310/12.25 |
| 6,992,755 B2 * | 1/2006 | Kubo | 355/72 |
| 8,008,884 B2 * | 8/2011 | Krupyshev et al. | 318/568.21 |
| 2005/0193920 A1 | 9/2005 | Fu et al. | |
| 2011/0050006 A1 * | 3/2011 | Huang | H01F 7/066 310/12.15 |

FOREIGN PATENT DOCUMENTS

| | | | | |
|---|---|---|---|---|
| EP | 1071118 B1 | 1/2001 | | |
| WO | 9715978 A1 | 5/1997 | | |
| WO | 02006187 A2 | 8/2002 | | |
| WO | 2005026801 A2 | 3/2005 | | |
| WO | 2007026270 | * | 3/2007 | H02K 41/035 |
| WO | 2007026270 A1 | 3/2007 | | |
| WO | 2009047741 | * | 4/2009 | H02P 25/06 |

* cited by examiner

ROTARY POSITIONING DEVICE

CROSS-REFERENCE TO PRIOR APPLICATIONS

This application is the U.S. National Phase application under 35 U.S.C. §371 of International Application No. PCT/IB2013/059138, filed on Oct. 5, 2015, which claims the benefit of U.S. Provisional Patent Application No. 61/710,087, filed on Oct. 5, 2012. These applications are hereby incorporated by reference herein.

FIELD OF THE INVENTION

The present invention relates to a rotary positioning device.

BACKGROUND OF THE INVENTION

In the high end semiconductor industry, machine positioning stages (also called positioning devices) are present which perform various functions. Guiding of these stages cannot be done in a conventional way (e.g. by use of ball bearing guides) due to vacuum and contamination requirements. Also other types of bearings (e.g. gas bearings) are difficult to use in such an environment.

Stages with contactless guidings based on magnetic forces seem very suitable for these types of applications. Commonly these types of stages are designed with six actuators, one for each degree of freedom. However, this increases the complexity and cost of the system hardware.

WO 2005/026801 A2 discloses an apparatus for manipulation of an optical element in up to six degrees of freedom with respect to a structure via at least three actuator devices. Each actuator device has at least two force-controlled actuators, which each produce an effective force along one degree of freedom, with linking points of the actuator devices acting directly on the optical element.

SUMMARY OF THE INVENTION

It is an object of the present invention to provide a rotary positioning device in which all six, degrees of freedom are actuated by a low number of hardware elements thus reducing system complexity and cost.

In an aspect of the present invention a positioning device is presented that comprises:

a circular magnetic track generating a magnetic field across a circular air gap, at least three forcers, each including a plurality of coils at least partly disposed with the circular air gap and each being operable for generating a levitation force in a levitation direction orthogonal to the circular magnetic track and a drive force in a drive direction along the circular magnetic track, said forcers being arranged at different angular positions along said circular magnetic track, and a controller for providing currents to said forcers for individually controlling the generation of a levitation force and/or a drive force by said forcers for effecting a rotational movement, a tilting movement and/or translational movement of said circular magnetic track.

Preferred embodiments of the invention are defined in the dependent claims.

According to the present invention a stage design is thus proposed in which six degrees of freedom are actuated by three or more two degrees of freedom actuators thus reducing system complexity and cost. The used two degrees of freedom actuators are preferably actuators of the kind described in WO 2007/026270 A1, in particular as shown in FIGS. 6 to 12 of this document, which document is herein incorporated by reference.

This document discloses an ironless magnetic motor employing a magnetic track and a forcer. The forcer is orientated in a magnetic field across a linear air gap of the magnetic track to generate a drive force parallel to the X drive axis and orthogonal to the Z levitation axis in response to a commutation drive current and to generate a force orthogonal to the X drive axis in response to a commutation coil current being superimposed on and phase shifted from the commutation drive current. This document particularly discloses a forcer including a coil disposed within the linear air gap, wherein a first set of levitating turns of the coil parallel to the X drive axis and orthogonal to the Z levitation axis is internal to magnetic field, wherein a second set of levitating turns of the coil parallel to the X drive axis and orthogonal to the Z levitation axis is external to magnetic field. A commutation drive current is applied to the coil to generate a drive force parallel to the X drive axis and orthogonal to the Z levitation axis, and a commutation levitating current is superimposed on and phase shifted from the commutation drive current to generate a levitating force orthogonal to the X drive axis and parallel to the Z levitation axis.

By arranging at least three (two degrees of freedom) forcers, e.g. of this type, at different positions of the circular magnetic track and by individually controlling said forcers rotational movements of the circular magnetic track (generally in an unlimited fashion) as well as a tilting movement of the circular magnetic track are possible.

In an embodiment said forcers are arranged at equal angular distances. This provides for an easier and more predictable control of the forcers.

Preferably, the proposed rotary positioning device comprises three forcers, in particular arranged at angular distances of substantially 120°. This provides the ability of effecting a six degree of freedom movement of the circular magnetic track. These movements include a rotational movement about a rotation axis that is arranged in the levitation direction of the circular magnetic track, tilting movements about tilting axes that are orthogonal to each other and to the rotation axis and translational movements in three orthogonal directions.

In a preferred embodiment the coils of the forcers each comprises levitating turns that are arranged substantially parallel to the drive direction and orthogonal to the levitation direction and drive turns that are arranged substantially parallel to the levitation direction and substantially orthogonal to the drive direction.

In another preferred embodiment the coils of the forcers each comprises:

a first set of levitating turns that are arranged internal to the magnetic field, a second set of levitating turns that are arranged external to the magnetic field, and an opposing set of drive turns that are arranged substantially internal to the magnetic field.

A preferred way of controlling is effected by a controller that is configured to magnetic track provide a drive current to a coil to generate a drive force and to provide a levitating current superimposed on and phase shifted from the drive current to the same coil to generate a levitating force.

Further, the controller is preferably configured to provide the phase shifting of the levitating current from the drive current such that the levitating force is at least substantially decoupled from the drive force. The positioning device can be controlled by an application controller on different levels depending how much functionality is implemented in the controller of the positioning device as will be explained in more detail below.

Still further, the controller is configured to provide a phase shifting of the levitating current from the drive current of 90°. This provides the advantage that the drive current is independent of the levitating current.

In still another embodiment the rotary positioning device further comprises a gravitation compensator, preferably arranged in the center of the magnetic track. This gravitation compensator relieves the forcers of an inefficient constant effort to counteract gravity. In a practical implementation said gravitation compensator comprises a first magnet fixedly mounted to the magnetic track and a second magnet opposite to the first magnet.

BRIEF DESCRIPTION OF THE DRAWINGS

These and other aspects of the invention will be apparent from and elucidated with reference to the embodiment(s) described hereinafter. In the following drawings

DETAILED DESCRIPTION OF THE INVENTION

First, an ironless magnetic linear motor as known from WO 2007/026270 shall be briefly described which enables an easier understanding of the proposed rotary positioning device that will be described later.

Figure 1:
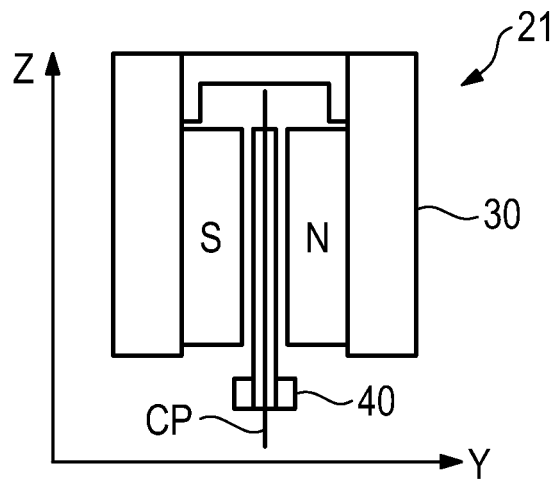
FIG. 1 illustrates a view of a first embodiment of an ironless magnetic linear motor in a Y-Z plane.
Figure 2:
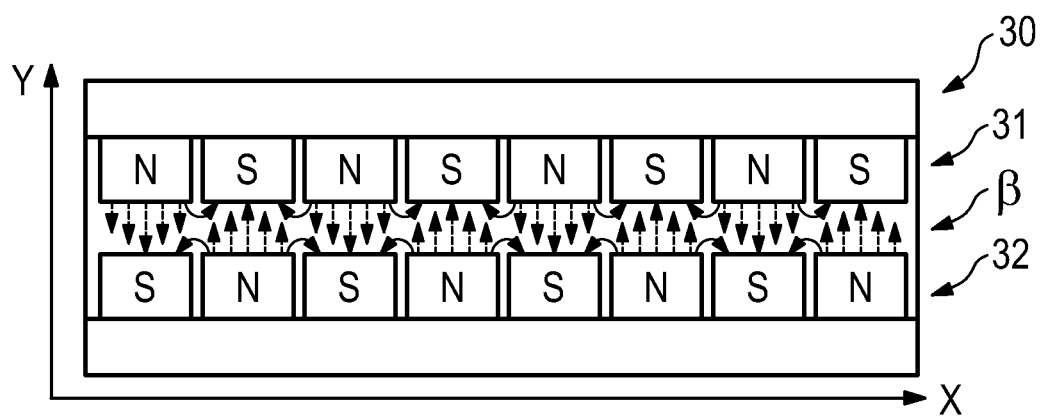
FIG. 2 illustrates a view of a linear air gap of a magnetic track of FIG. 1 in a X-Y plane.
Figure 3:
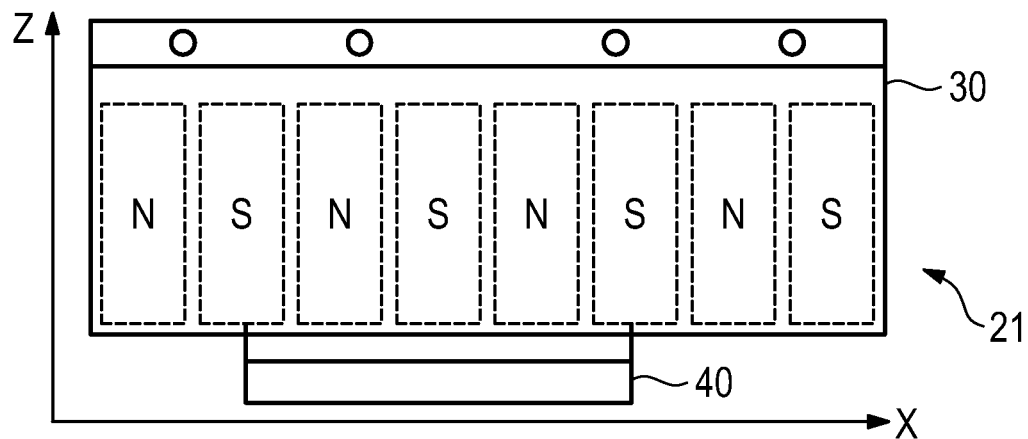
FIG. 3 illustrates a view of an ironless magnetic linear motor in a X-Z plane.

FIG. 1 shows a cross section in a Y-Z plane of a first embodiment of an ironless magnetic linear motor 21 employing a magnetic track 30 and a forcer 40. FIG. 2 shows a cross section in a X-Y plane of an embodiment of the magnetic track 30. The magnetic track 30 includes a linear magnetic array 31 and a linear magnetic array 32 for generating a magnetic field $\beta$ across a linear air gap. Linear magnetic arrays 31 and 32 have 180° degree spatial separation between adjacent magnets. FIG. 3 shows a side view of the first embodiment of the ironless magnetic linear motor 21.

Figure 4:
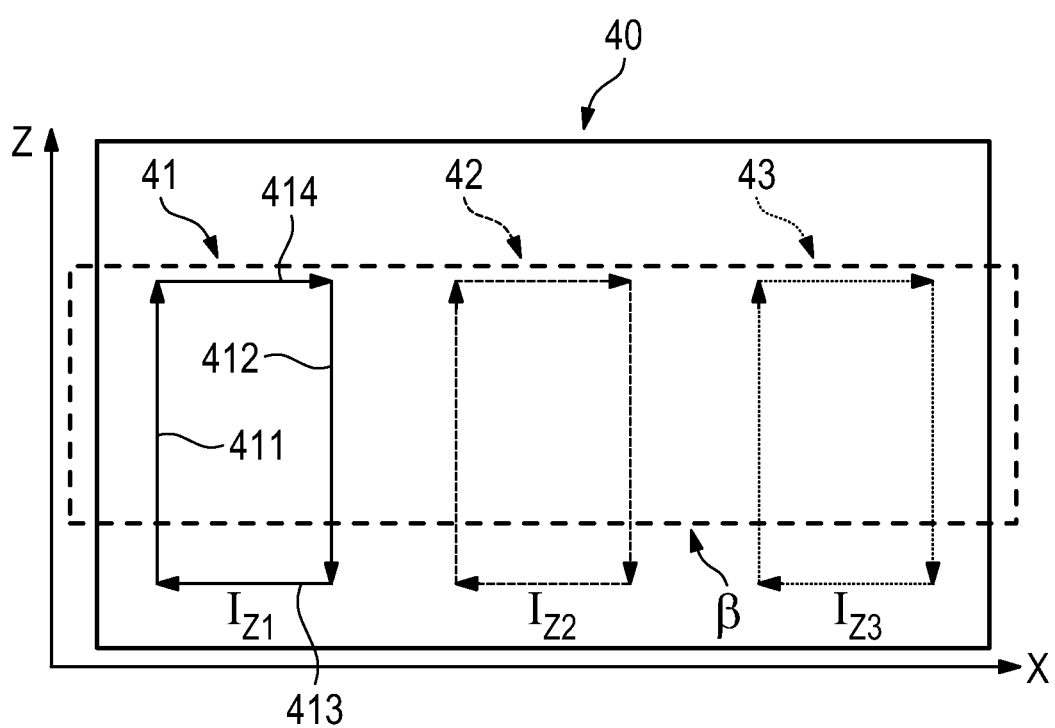
FIG. 4 illustrates a view of an application of commutation levitating currents to a forcer shown in FIG. 1 in a X-Z plane.

Referring to FIG. 1, the forcer 40 is disposed within the linear air gap along a center X-Z longitudinal plane CP of the linear air gap. As shown in FIG. 4 showing a side view of the forcer 40, the forcer 40 includes, as an example, three coils 41-43 with a 120°+n*360 degree spatial separation (n is an arbitrary integer) between adjacent coils. In FIG. 4 coil 41 of forcer 40 is represented by its flow path for a commutation levitating current $I_{Z1}$, coil 42 is of forcer 40 is represented by its flow path for a commutation levitating current $I_{Z2}$, and coil 43 of forcer 40 is represented by its flow path for a commutation levitating current $I_{Z3}$.

Figure 5:
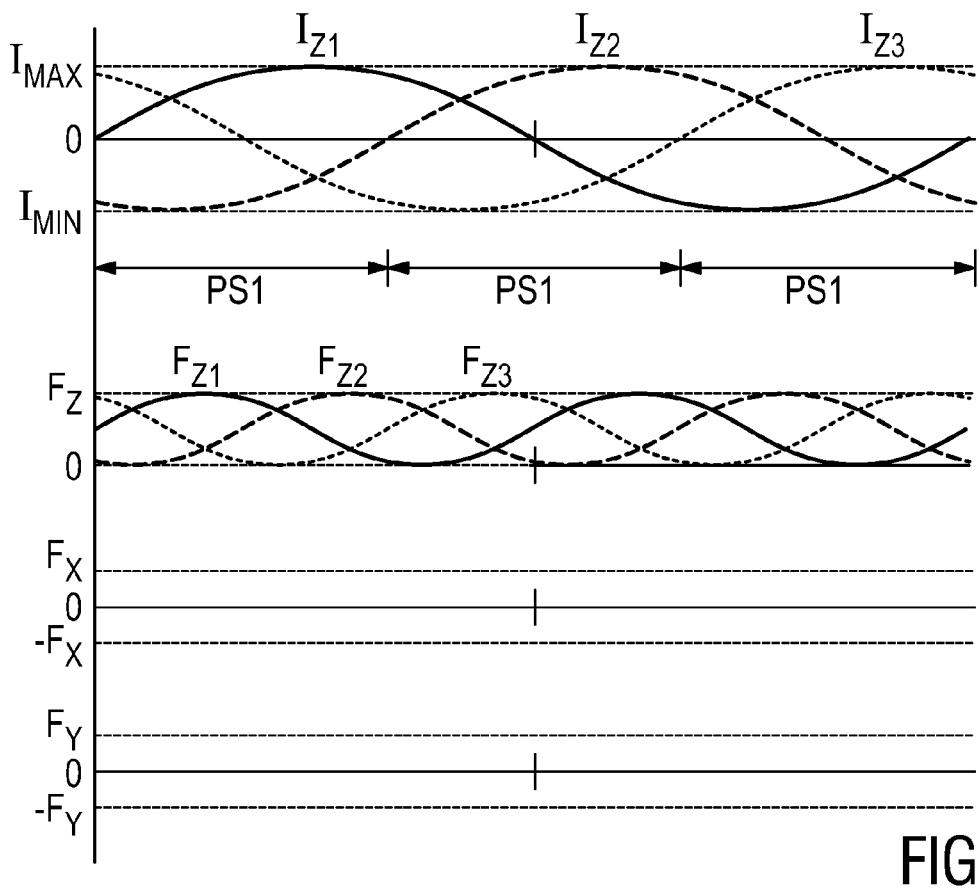
FIG. 5 illustrates exemplary commutation levitating currents applied to the forcer shown in FIG. 4 and an exemplar levitation force generated by the forcer in response to the commutation levitating currents.

Opposing sets of drive turns 411, 412 of coils 41-43 (indicated only for coil 41 in FIG. 4) orthogonal to the X drive axis and parallel to the Z levitation axis are internal to magnetic field $\beta$ as best shown in FIG. 4. One set of levitating turns 413 of coils 41-43 (indicated only for coil 41 in FIG. 4) parallel to the X drive axis and orthogonal to the Z levitation axis from a bottom perspective of FIG. 4 is external to magnetic field $\beta$, while the opposing set of levitating turns 414 of coils 41-43 (indicated only for coil 41 in FIG. 4) parallel to the X drive axis and orthogonal to the Z levitation axis from a top perspective of FIG. 4 is internal to magnetic field $\beta$. As a result, an application of a 120° phase shift PS1 of commutation levitating currents $I_{Z1}$, $I_{Z2}$ and $I_{Z3}$ to coils 41-43, respectively, generates a levitating force $F_Z$ parallel to the Z levitating axis as best shown in FIG. 5.

Figure 6:
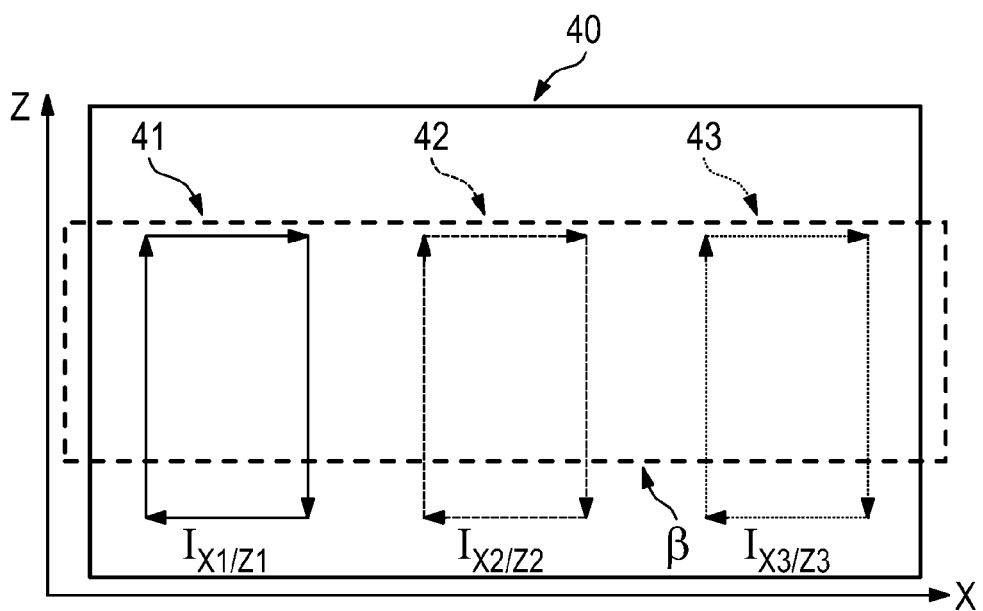
FIG. 6 illustrates a view of an application of superimposed commutation drive currents and commutation levitating currents to the forcer shown in FIG. 1 in a X-Z plane.
Figure 7:
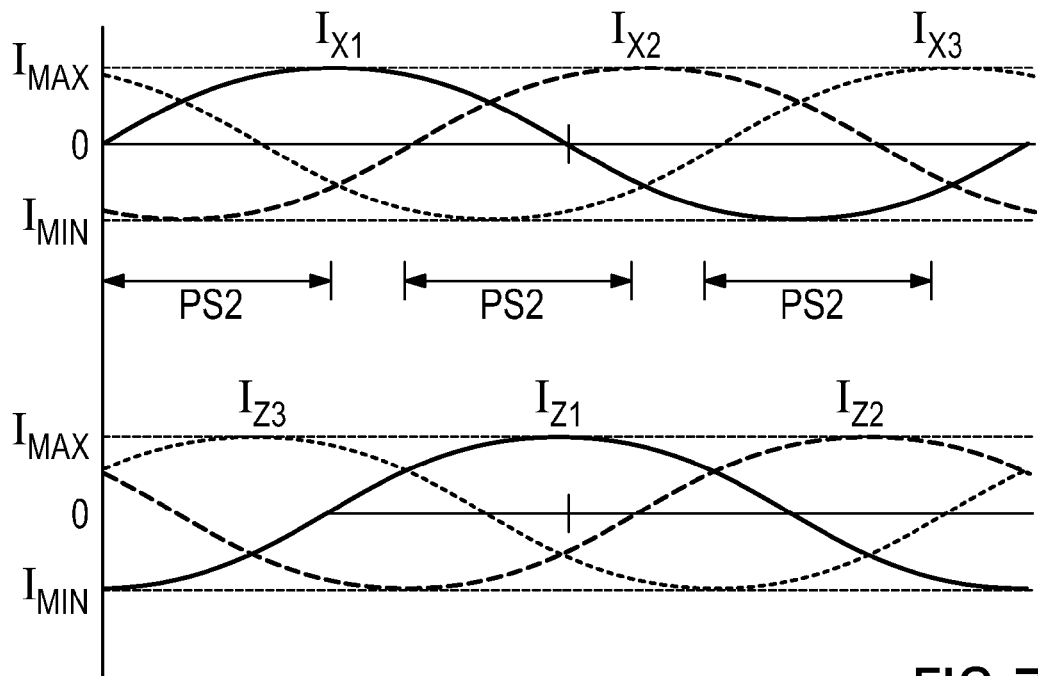
FIG. 7 illustrates exemplary phase shifting of commutation drive currents and commutation levitating currents as applied to the forcer shown in FIG. 6.

Further, the linear motor 21 provides for a phase shifting of a superimposition of commutation levitating currents $I_{Z1}$, $I_{Z2}$ and $I_{Z3}$ on commutation drive currents $I_{X1}$, $I_{X2}$ and $I_{X3}$, respectively, to facilitate a maximum decoupling, if not a complete decoupling, of drive force $F_X$ and levitating force $F_Z$. Specifically, as shown in FIG. 6, coil 41 of forcer 40 is represented by its flow path for a superimposition of commutation levitating current $I_{Z1}$ on commutation drive coil $I_{X1}$, coil 42 of forcer 40 is represented by its flow path for a superimposition of commutation levitating current $I_{Z2}$ on commutation drive coil $I_{X2}$, and coil 43 of forcer 40 is represented by its flow path for a superimposition of commutation levitating current $I_{Z3}$ on commutation drive coil $I_{X3}$. As shown in FIG. 7, commutation levitating current $I_{Z1}$ is phase shifted from commutation drive coil $I_{X1}$ by a 90° phase shift PS2, commutation levitating current $I_{Z2}$ is phase shifted from commutation drive coil $I_{X2}$ by 90° phase shift PS2, and commutation levitating current $I_{Z3}$ is phase shifted from commutation drive coil $I_{X3}$ by 90° phase shift PS2.

Figure 8:
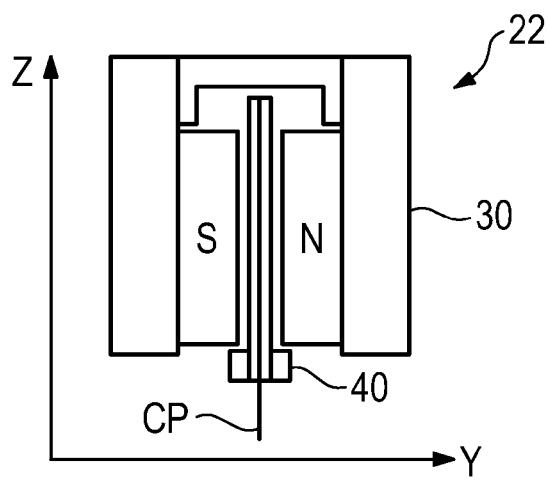
FIG. 8 illustrates a view of a second embodiment of an ironless magnetic linear motor in a Y-Z plane.
Figure 9:
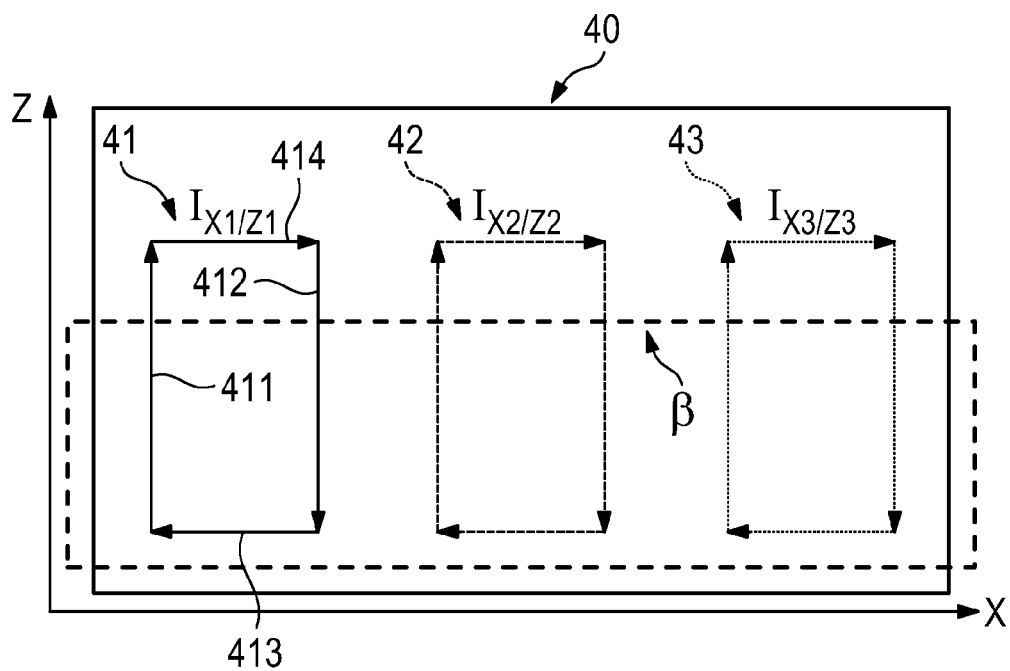
FIG. 9 illustrates a view of an application of superimposed commutation drive currents and commutation levitating currents to a forcer shown in FIG. 8 in a X-Z plane.

Referring to FIG. 8, a second embodiment of an ironless magnetic linear motor 22 employing magnetic track 30 and forcer 40 with forcer 40 having a opposite orientation within the linear air gap as compared to the forcer 40 orientation of the linear air gap of motor 21 (as shown in FIG. 1). Specifically, opposing sets of drive turns 411, 412 of coils 41-43 orthogonal to the X drive axis and parallel to the Z levitation axis are internal to magnetic field $\beta$ as best shown in FIG. 9. One set of levitating turns 414 of coils 41-43 parallel to the X drive axis and orthogonal to the Z levitation axis from a top perspective of FIG. 9 is external to magnetic field $\beta$, while the opposing set of levitating turns 413 of coils 41-43 parallel to the X drive axis and orthogonal to the Z levitation axis from a bottom perspective of FIG. 9 is internal to magnetic field $\beta$. As a result, an application of a 120° phase shift PS1 of commutation levitating currents $I_{Z1}$, $I_{Z2}$ and $I_{Z3}$ to coils 41-43, respectively, generates a levitating force $F_Z$ parallel to the Z levitating axis as best shown in FIG. 5.

Figure 10:
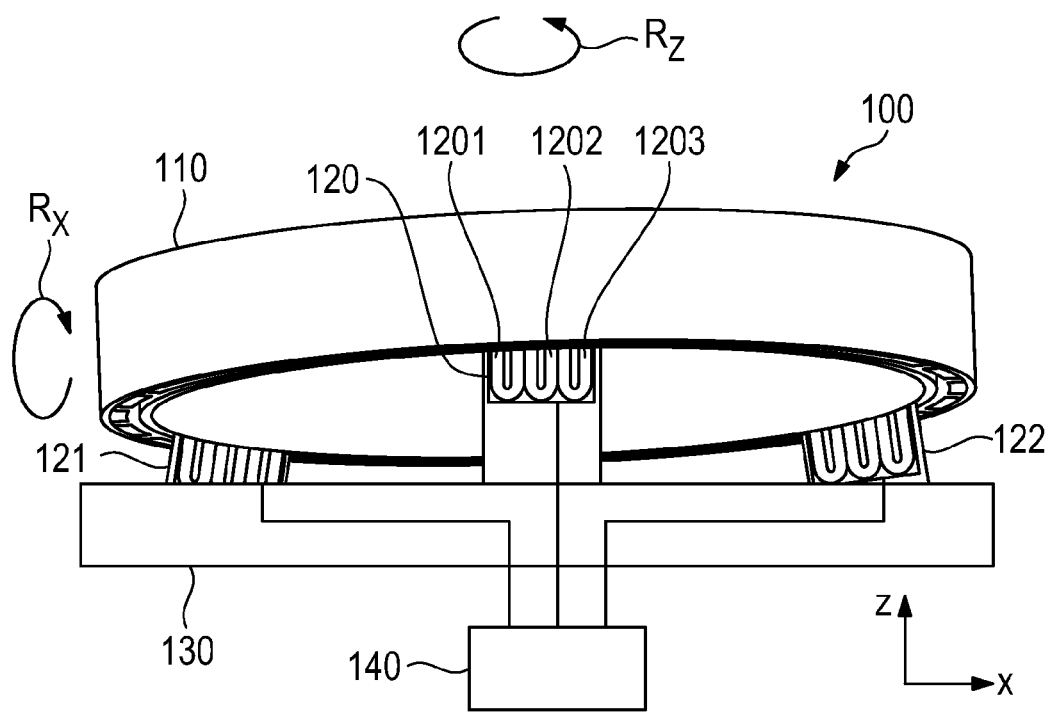
FIG. 10 illustrates a perspective view of a first embodiment of a rotary positioning device according to the present invention.
Figure 11:
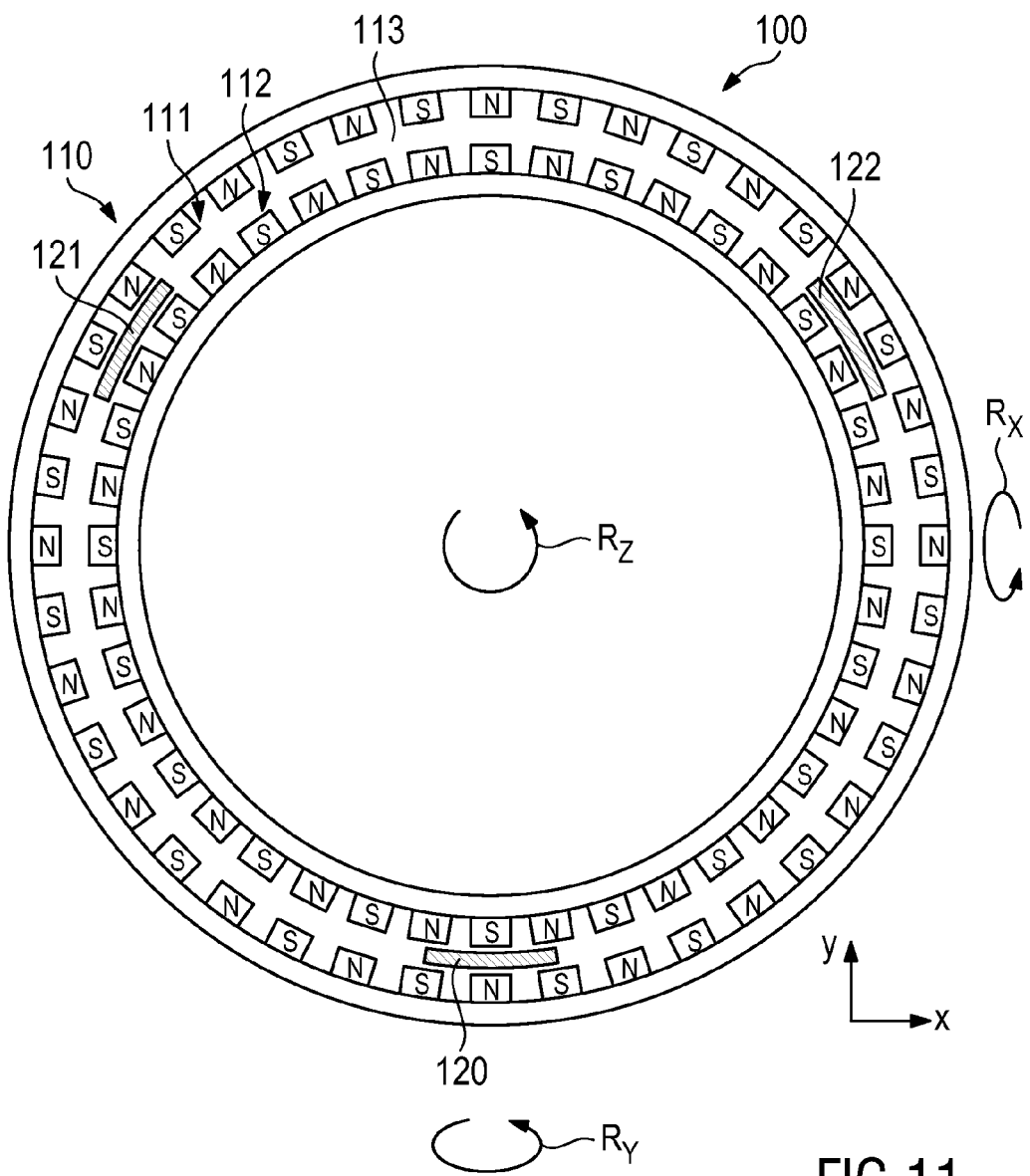
FIG. 11 shows a top view of the first embodiment of the rotary positioning device.

FIG. 10 shows a perspective view of a first embodiment of a rotary positioning device 100 according to the present invention. FIG. 11 shows a top view of the first embodiment of the rotary positioning device 100.

The rotary positioning device 100 comprises a circular magnetic track 110 generating a magnetic field across a circular air gap 113. The circular magnetic track 110 is generally formed in the same way as the linear magnetic track 30 shown in FIG. 2 and includes a first (outer) circular magnetic array 111 comprising a plurality of magnets and a second (inner) magnetic array 112 comprising a plurality of magnets for generating a magnetic field across the linear air gap 113, wherein the magnets (i.e. the magnetic poles) of each of said magnetic arrays 111 and 112 are alternately arranged. Circular magnetic arrays 111 and 112 have 180° degree spatial separation between adjacent magnets, i.e. a magnetic north pole of the magnetic array 111 is arranged opposite to a magnetic south pole of the magnetic array 112.

In an embodiment curved magnets are used in the magnetic arrays 111 and 112 which help to increase the movement range of the magnetic track 110 in the gap but are not necessary to work. Further, in an embodiment more magnets lead to less force ripple but are not required for working.

The rotary positioning device 100 further comprises three (in general at least two) forcers 120, 121, 122 which are e.g. disposed on a (generally stationary) carrier structure 130. The forcers may be of the same kind as shown above, particularly in FIGS. 1, 4, 6, 8 and 9. Generally, each forcer 120, 121, 122 includes a plurality of coils (in this embodiment three coils 1201, 1202, 1203 indicated for forcer 120). These coils are at least partly disposed with the circular air gap 113 and are each operable for generating a levitation force in a levitation direction (here in Z direction) orthogonal to the circular magnetic track 110 and a drive force in a drive direction (here in rotational direction Rz about the Z axis) along the circular magnetic track. As shown in FIGS. 10 and 11 the forcers 120, 121, 122 are arranged at different angular positions along said circular magnetic track, preferably at equal angular distances.

Still further, the rotary positioning device 100 comprises a controller 140 for providing currents to said forcers 120, 121, 122 for individually controlling the generation of a levitation force and/or a drive force by said forcers for effecting a rotational movement (i.e. particularly in Rz direction), and/or a tilting movement (i.e. particularly a rotation in Rx and/or Ry direction) and/or a translational movement (i.e. particularly in X, Y and/or Z direction) of said circular magnetic track 110.

Hereby, a (generally unlimited) rotational movement (i.e. particularly in Rz direction) of the circular magnetic track 110 is achieved by controlling the forcers 120, 121, 122 to provide a drive force. A tilting movement (i.e. particularly a rotation in Rx and/or Ry direction) of the circular magnetic track 110 is achieved by controlling two or more (depending on the desired tilting direction) of the forcers 120, 121, 122 to provide an additional levitation force on one and decrease the levitation force in the other one or two forcers. A translational movement (i.e. particularly in X, Y and/or Z direction) of the circular magnetic track 110 is achieved by controlling one or more of the forcers 120, 121, 122 to provide a drive force and/or a levitation force. In particular, to achieve a translational movement in Z direction all forcers 120, 121, 122 are controlled to provide a levitation force. To achieve a translational movement in X and/or Y direction two or three forcers 120, 121, 122 are controlled to provide a drive force and the other forcers are controlled to provide a levitation force to compensate for possible undesired tilt couples due to the drive forces if the drive forces actuate at a different Z-height than the center of gravity of the magnetic track.

Without gravity compensator, a levitation force always needs to be present. Movements in a vertical plane are realized by increasing or decreasing this levitation force. With a gravity compensator (see below) the constant levitation force is realized by a passive element, e.g. opposing polarity magnets or a weak spring.

Thus, according to an embodiment of the proposed rotary positioning device, a six DOF (degrees of freedom) contactless linear motion platform with six DOF active control including three multiphase ironless forcers combined with a circular magnetic track is provided. No additional guiding is necessary. The rotary positioning device also acts as an active guiding component which can additionally be used as a functional stroke in five degrees of freedom perpendicular to the rotational direction.

For controlling the positioning device, in an embodiment the position of the magnetic track is sensed. Then, a position error in Cartesian coordinates (x, y, Rx, Ry, Rz) with respect to the desired setpoint is calculated. Thereafter, a required force to correct for the setpoint calculated. Then, a required levitation and driving force per actuator is calculated. Finally, the two position dependant currents (commutation currents) are calculated to produce the required forces per actuator.

Generally, the positioning device can be controlled by an application controller on different levels depending how much functionality is implemented in the controller of the positioning device. The lowest level is to direct each actuator with two currents which are position dependent (commutation) and dependent of the drive force and of the levitation force. The next level is where the commutation of each actuator is implemented in the controller, meaning that the application controller sends a required levitation and driving force to the controller of the positioning device which in turn calculates the required currents. In still another level the application controller sends orthogonal forces (x, y, z, Rx, Ry, Rz) to the controller of the positioning device (which acts as in the previous level mentioned above. Finally, in another level the application controller provides position setpoints and movement profiles (e.g. v, a, j, with v=velocity, a=acceleration, j=jerk) to the controller.

Figure 12:
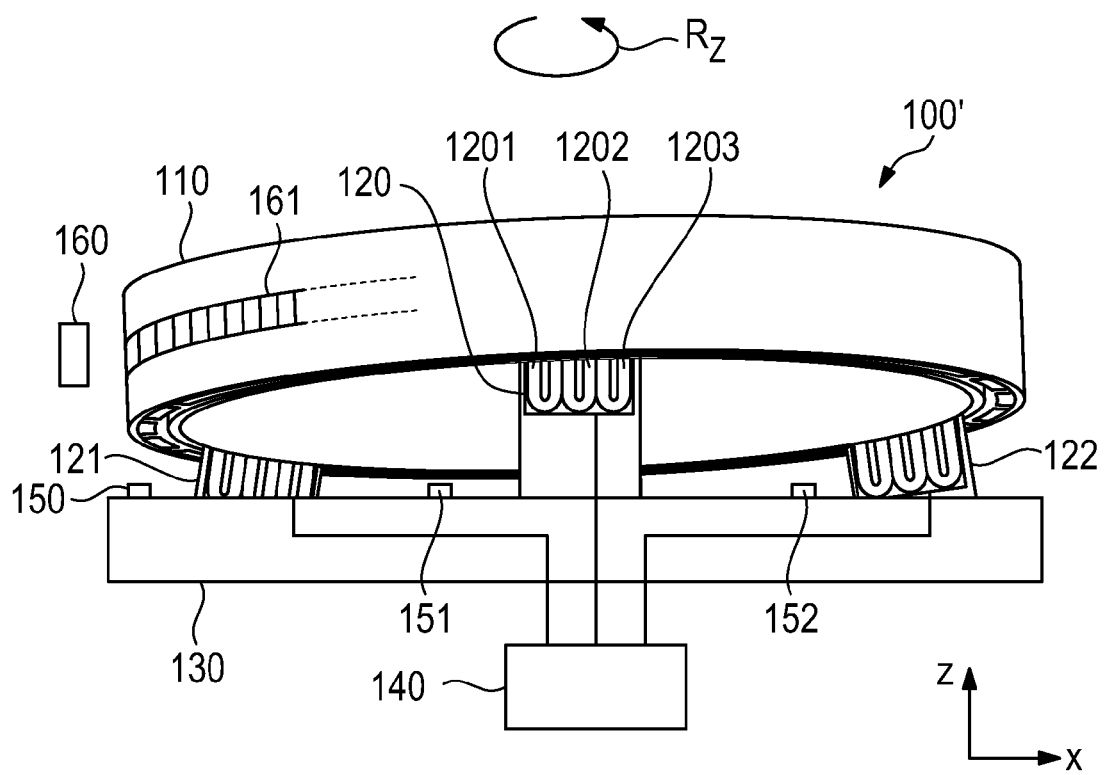
FIG. 12 illustrates a perspective view of a second embodiment of a rotary positioning device according to the present invention.

FIG. 12 shows a perspective view of a second embodiment of the rotary positioning device 100' according to the present invention. According to this embodiment X, Y, Z, Rx and/or Ry positions are measured by means of multiple sensors 150, 151, 152, e.g. by means of inductive capacitive sensors, placed on the fixed world, e.g. on the carrier structure 130, looking at a reference surface of the rotor. Further, in this embodiment the Rz position is measured by a conventional optical linear measurement system comprising a scale 161 and a sensor head 160, preferably with the scale placed on the moving body, i.e. the circular magnetic track.

In an alternative embodiment (not shown) multiple encoder heads can be used which are placed on the fixed world and scales are placed on the moving body (the circular magnetic track) to measure all six degrees of freedom. For instance, with a configuration of three encoder heads looking at one rotary scale, three degrees of freedom can be measured.

However, any other type of sensor suitable for the required ranges would be equally applicable.

Figure 13:
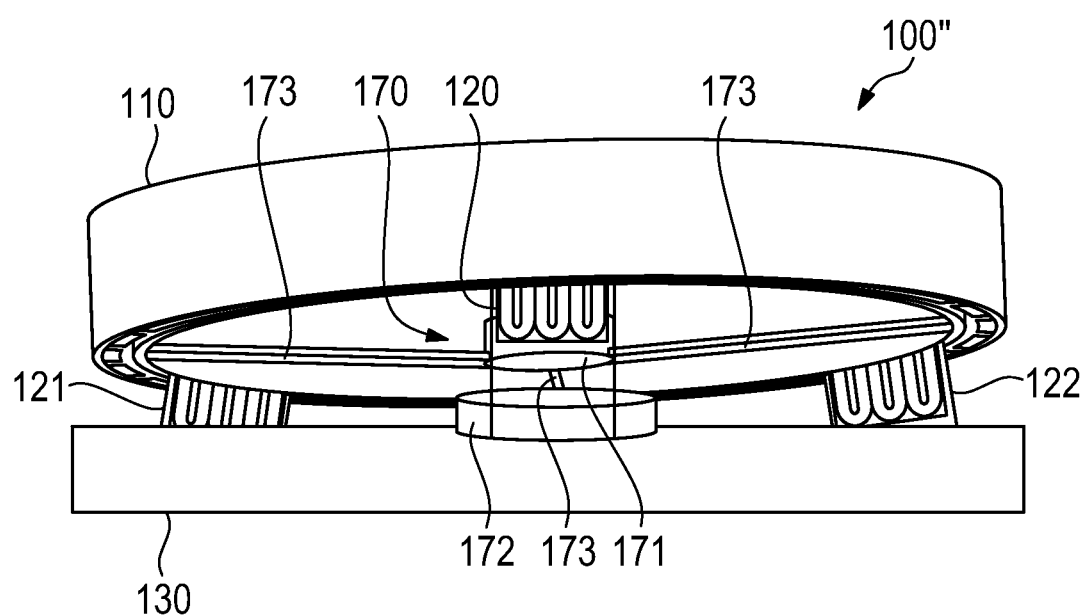
FIG. 13 illustrates a perspective view of a third embodiment of a rotary positioning device according to the present invention.
Figure 14:
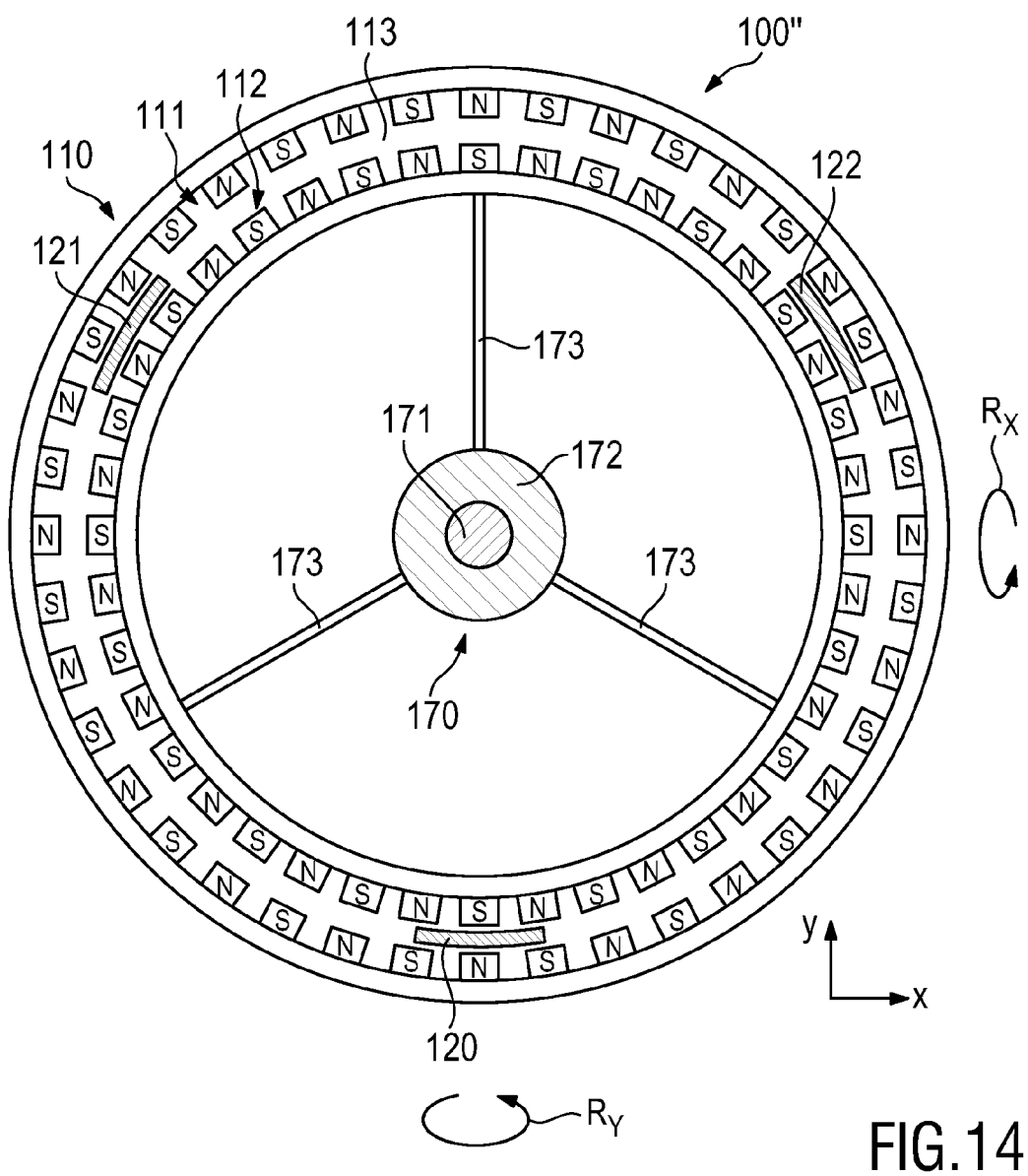
FIG. 14 shows a top view of the third embodiment of the rotary positioning device.

FIG. 13 shows a perspective view of a third embodiment of the rotary positioning device 100" according to the present invention. FIG. 14 shows a top view of the third embodiment of the rotary positioning device 100". According to this embodiment a gravitation compensator 170 is arranged in the center of the magnetic track 110 for gravity compensation.

In this embodiment the gravity compensator 170 is implemented by two magnets 171, 172 of opposing polarity in the center area of the positioning device 100". One magnet 171 is mounted on the moving magnetic track 110, for instance by use of radially arranged spokes 173. The other magnet 172 is arranged static, e.g. mounted on the carrier structure 130. The magnets 171, 172 are e.g. arranged such that their polarities are pointing in opposite directions. For instance, in an embodiment the north pole of the magnet 171 is facing the magnet 172, whose north pole is facing the magnet 171.

The magnets 171, 172 thus provide a static force to lift the magnetic track 110 to reduce the constant current that otherwise needs to be driven through the coils of the forcers 120, 121, 122 to lift the magnetic track 110. This implementation results in a high stiffness between the magnetic track 110 and the static carrier structure 130. In other configurations magnets or gravity compensators having a lower stiffness or weak springs are used.

In summary, according to an embodiment of the present invention a full floating in 6 degrees of freedom, completely magnetically levitated rotary positioning device with a ironless circular magnetic track, three multi-phase forcers, appropriate sensors and a control scheme is provided. The device can be expanded with a gravity compensator e.g. using permanents magnet in the center of rotation to compensate for gravity forces.

The device can be designed completely free of mechanical contacts, thereby facilitating vacuum operation, low contamination long lifetime performance. Due to the specific combination of forcers, a very cost effective, lightweight and simple design is provided with a relatively small volume claimed that makes typically high accelerations and velocities feasible. Power dissipation is also relatively small since the moving mass is limited by design and at least for configurations with a gravity compensator to compensate for gravity, the standstill gravity forces are compensated by the forces induced by the gravity compensator.

By the proposed forcers independent actuation forces can be achieved in two orthogonal directions, e.g. with just off the shelf linear motor forcers and magnetic tracks, by the superposition of two commutation laws that are orthogonal. In this way a linear motor (one main force direction) becomes a planar motor (a second independent addressable force in a direction perpendicular to the first force).

By the proposed smart configuration of two or more of such forcers combined with a circular magnetic track, e.g. three forcers disposed at 120° the following advantages are achieved:

Lifetime performance: Due to the absence of mechanical contact in the bearings the lifetime of the device would theoretically be infinite.

Dynamic performance: The absence of mechanical contact (=friction forces) enables more accurate positioning of the device.

Wireless: The (potential) absence of any cabling between fixed world and moving device will further increase lifetime and dynamic performance (due to the absence of disturbance forces from cabling).

Reduced device complexity and cost: compared to other devices which use actuators for each of the six degrees of freedom the proposed invention requires only three actuators for six degrees of freedom.

Contamination free: Due to the absence of mechanical contact in the device the generation of unwanted particles can be avoided making the device suitable for e.g. semiconductor manufacturing applications. Due to the absence of lubricants any molecular contamination (e.g. due to out-gassing or cross-contamination) involved with lubricants will be avoided.

Potential application areas of the invention are:

Semiconductor manufacturing equipment, electronics assembly and mechanization.

General usage positioning stages for positioning of samples and/or substrates in reactive or aggressive environments (no cabling, no sparking, no lubricants).

Positioning stages suitable for high accelerations and velocities (lightweight, peak force/moving mass ratio is very high of this design).

Positioning devices for application in vacuum environments.

Production equipment.

Positioning devices for medical applications (e.g. shutter blades in X-ray devices).

Consumer electronics (CD/DVD/Blu-Ray drive systems).

Energy storage (flywheel).

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A rotary positioning device comprising:
a circular magnetic track generating a magnetic field across a circular air gap,
at least three multiphase ironless forcers, each said forcer including a plurality of coils at least partly disposed with the circular air gap and each said forcer being operable for generating a levitation force in a levitation direction orthogonal to the circular magnetic track and a drive force in a drive direction along the circular magnetic track, said forcers being arranged at different angular positions along said circular magnetic track, and
a controller for providing currents to said forcers for individually controlling the generation of a levitation force and a drive force by said forcers for effecting six degrees of freedom active control of a rotational movement, a tilting movement and a translational movement of said circular magnetic track, wherein for effecting active control of the tilting movement, the controller further for providing currents to two or more of said forcers to provide an additional levitation force on one of said forcers and decrease a levitation force in another one or two of said forcers.

2. The rotary positioning device as claimed in claim 1, wherein said forcers are arranged at equal angular distances.

3. The rotary positioning device as claimed in claim 1, wherein said at least three forcers comprise three forcers arranged at angular distances of substantially 120°.

4. The rotary positioning device as claimed in claim 1, wherein the coils of the forcers each comprise levitating turns that are arranged substantially parallel to the drive direction and orthogonal to the levitation direction and drive turns that are arranged substantially parallel to the levitation direction and substantially orthogonal to the drive direction.

5. The rotary positioning device as claimed in claim 4, wherein the coils of the forcers further comprise:
 a first set of levitating turns that are arranged internal to the magnetic field,
 a second set of levitating turns that are arranged external to the magnetic field, and
 an opposing set of drive turns that are arranged substantially internal to the magnetic field.

6. The rotary positioning device as claimed in claim 1, wherein the controller is configured to provide a drive current to a coil to generate a drive force and to provide a levitating current superimposed on and phase shifted from the drive current to the same coil to generate a levitating force.

7. The rotary positioning device as claimed in claim 6, wherein the controller is further configured to provide the phase shifting of the levitating current from the drive current such that the levitating force is at least substantially decoupled from the drive force.

8. The rotary positioning device as claimed in claim 6, wherein the controller is further configured to provide a phase shifting of the levitating current from the drive current of 90°.

9. The rotary positioning device as claimed in claim 1, further comprising a gravitation compensator.

10. The rotary positioning device as claimed in claim 9, wherein said gravitation compensator is arranged at a center of the circular magnetic track.

11. The rotary positioning device as claimed in claim 10, wherein said gravitation compensator comprises a first magnet fixedly mounted to the magnetic track and a second magnet opposite to the first magnet.

\* \* \* \* \*